United States Patent
Moeller

(10) Patent No.: US 11,122,700 B2
(45) Date of Patent: Sep. 14, 2021

(54) ELECTRICAL ASSEMBLY

(71) Applicant: Robert Bosch GmbH, Stuttgart (DE)

(72) Inventor: Stefan Moeller, Friedrichswerth (DE)

(73) Assignee: Robert Bosch GmbH, Stuttgart (DE)

( * ) Notice: Subject to any disclaimer, the term of this patent is extended or adjusted under 35 U.S.C. 154(b) by 297 days.

(21) Appl. No.: 16/464,868

(22) PCT Filed: Sep. 5, 2017

(86) PCT No.: PCT/EP2017/072188
§ 371 (c)(1),
(2) Date: Jul. 2, 2019

(87) PCT Pub. No.: WO2018/099620
PCT Pub. Date: Jun. 7, 2018

(65) Prior Publication Data
US 2019/0320539 A1    Oct. 17, 2019

(30) Foreign Application Priority Data

Dec. 2, 2016    (DE) ..................... 10 2016 224 083.8

(51) Int. Cl.
*H05K 5/00* (2006.01)
*H01G 9/08* (2006.01)
(Continued)

(52) U.S. Cl.
CPC .............. *H05K 5/0082* (2013.01); *H01G 9/08* (2013.01); *H01G 9/26* (2013.01); *H05K 3/284* (2013.01);
(Continued)

(58) Field of Classification Search
CPC .... H05K 5/0082; H05K 3/284; H05K 5/0034; H05K 2203/1316; H05K 2203/1327; H01G 9/08; H01G 9/26
See application file for complete search history.

(56) References Cited

U.S. PATENT DOCUMENTS 6,969,640 B1 * 11/2005 Dimaano, Jr. ........ H01L 21/565
257/E21.504
2004/0052061 A1    3/2004 Matsuno et al.
(Continued)

FOREIGN PATENT DOCUMENTS

CN    101384140 A    3/2009
CN    101399259 A    4/2009
(Continued)

OTHER PUBLICATIONS

International Search Report corresponding to PCT Application No. PCT/EP2017/072188, dated Nov. 22, 2017 (German and English language document) (5 pages).

*Primary Examiner* — Michael P McFadden
(74) *Attorney, Agent, or Firm* — Maginot, Moore & Beck LLP

(57) ABSTRACT

An electrical assembly includes a printed circuit board substrate, at least one electrical component which is arranged on the printed circuit board substrate and with which the printed circuit board substrate makes electrical contact, a protective cap which is arranged above the electrical component, and a sheathing material which is applied to the printed circuit board substrate over the protective cap and which covers at least the protective cap on the outside in such a way that the protective cap is provided with at least one filling opening. The sheathing material is introduced through the at least one filling opening into a cap interior between the protective cap and the printed circuit board substrate in such a way that a clearance, which is not filled with the sheathing material and which directly adjoins the at least one electrical component, remains between the protective cap and the printed circuit board substrate.

14 Claims, 3 Drawing Sheets

(51) Int. Cl.
*H01G 9/26* (2006.01)
*H05K 3/28* (2006.01)

(52) U.S. Cl.
CPC ... *H05K 5/0034* (2013.01); *H05K 2203/1316* (2013.01); *H05K 2203/1327* (2013.01)

(56) References Cited

U.S. PATENT DOCUMENTS

| | | | | |
|---|---|---|---|---|
| 2009/0038843 | A1* | 2/2009 | Yoneda | H01L 27/14618 |
| | | | | 174/521 |
| 2009/0218492 | A1* | 9/2009 | Kierse | H01L 27/1446 |
| | | | | 250/338.4 |
| 2011/0169155 | A1* | 7/2011 | Ogihara | H01L 23/562 |
| | | | | 257/687 |
| 2016/0049349 | A1* | 2/2016 | Lane | H01L 25/03 |
| | | | | 257/777 |

FOREIGN PATENT DOCUMENTS

| | | |
|---|---|---|
| CN | 103229607 A | 7/2013 |
| CN | 103851176 A | 6/2014 |
| CN | 104428954 A | 3/2015 |
| CN | 104718804 A | 6/2015 |
| CN | 104919586 A | 9/2015 |
| CN | 105493648 A | 4/2016 |
| CN | 106068682 A | 11/2016 |
| DE | 10 2012 204 630 A1 | 9/2013 |
| DE | 10 2015 205 054 A1 | 9/2016 |
| WO | 2014/054145 A1 | 4/2014 |
| WO | 2015/029629 A1 | 3/2015 |

* cited by examiner

ELECTRICAL ASSEMBLY

This application is a 35 U.S.C. § 371 National Stage Application of PCT/EP2017/072188, filed on Sep. 5, 2017, which claims the benefit of priority to Serial No. DE 10 2016 224 083.8, filed on Dec. 2, 2016 in Germany, the disclosures of which are incorporated herein by reference in their entirety.

BACKGROUND

Electronic transmission control modules are installed on or in the transmission for control purposes and can be exposed to the aggressive transmission fluid. The transmission control modules comprise electrical assemblies that have to be protected from the transmission fluid. The electrical assemblies can comprise a circuit board substrate as a circuit carrier, on which electrical components are fitted that are electrically contacted via conducting tracks of the circuit board substrate. In addition to metallic cover parts arranged over the electrical components on the circuit board substrate for protection, it is also known to use an encapsulating material applied to the circuit board substrate to protect the electrical components. The encapsulating material can be applied over the electrical components to be protected on the circuit board substrate as a molding material in a casting process or as a casting material.

From DE 10 2015 205 054 A1 an electronics module for a transmission control unit is known, in which the electronic module comprises a circuit board substrate on which at least one unhoused semiconductor component is disposed. To protect the unhoused semiconductor component from ionizing radiation, a protective cap is placed on the circuit board substrate over the semiconductor component. The protective cap is completely covered with an encapsulating material of thermosetting material, for example, that is applied to the circuit board substrate (and to other electrical components placed outside the protective cap).

SUMMARY

The disclosure concerns an electrical assembly, in particular for use in a hydraulic fluid of a motor vehicle transmission, which comprises a circuit board substrate and at least one electrical component on the circuit board substrate and in electrical contact with the circuit board substrate. A protective cap is placed over the electrical component. An encapsulating material applied to the circuit board substrate over the protective cap covers at least the protective cap. According to the disclosure, it is provided that the protective cap is provided with at least one filling opening and that the encapsulating material is introduced through the at least one filling opening into an interior of the cap between the protective cap and the circuit board substrate such that there is a free space between the protective cap and the electrical component, which is not filled with the encapsulating material and which directly adjoins at least one electrical component.

The electrical assembly can be a part of an electronic transmission control module or can include an electronic transmission control module without being limited to this. The electrical assembly can also be part of a sensor module or can contain a sensor module. The electrical assembly can be installed in or on the vehicle transmission. However, other uses are also conceivable.

A circuit board substrate means a supporting substrate for electrical components, which comprises conducting tracks for connecting the electrical components to a control circuit or for making contact between the electrical components. A circuit board substrate can in particular be a rigid circuit board made of fiberglass-reinforced epoxy resin (FR4 or higher grade), a ceramic carrier substrate (for example, a hybrid circuit) or a flexible conductor film.

An encapsulating material means a protective material that is fluid in the original state and that is a protective material that is cured during or after application. Preferably, it is a thermosetting material, especially an epoxy resin. The encapsulating material can be applied to the circuit board substrate, for example, by means of a transfer molding process, a compression molding process, a thermosetting material injection process or a casting method.

The electrical assembly according to the disclosure advantageously provides protection from the resulting thermal and/or mechanical loads for at least one electrical component during the application of the encapsulating material. This is particularly advantageous, for example, to protect the large beaker-shaped enclosures of electrolytic capacitors from damage caused by pressure spikes during thermosetting material injection or transfer molding. The protective cap reduces the loads on the component. By providing the protective cap with at least one filling opening and partially introducing the encapsulating material into an interior of the cap between the protective cap and the circuit board substrate, the protection of the electrical connections of the component is achieved and excessively large air spaces under the encapsulating material are avoided that could lead to crack formation in the encapsulating material during operation due to temperature fluctuations or pressure fluctuations. In addition, the encapsulating material stabilizes the at least one electrical component against shock and/or vibration loads and thus relieves the electrical connections of the loads.

There is only a small free space (cavity) between the protective cap and the circuit board substrate, which is not filled with encapsulating material and which directly adjoins at least one electrical component. This free space advantageously forms a receiving space into which the electrical component or parts of the electrical component can partially expand. The free space can be filled with air or another gas. The free space, for example, forms a receiving space that can receive the leaking gases or acids in the unlikely event of out gassing or bursting of an electrolytic capacitor without the encapsulating material being able to break up. The remaining electrical components on the circuit board substrate and the electronic circuit are therefore still protected against the aggressive transmission fluid even in the event of a defect of a single electrical component.

Advantageous embodiments and developments of the disclosure are made possible by the features indicated described herein.

Advantageously, at least one filling opening of the protective cap is connected to the free space by a channel structure that is labyrinthine, in particular U-shaped in cross-section when viewed perpendicularly to the circuit board substrate. The channel structure ensures that the encapsulating material entering the interior of the cap first penetrates towards the area of the circuit board substrate facing the interior of the cap and covers it and only then rises in the interior of the cap without entering the open space.

The at least one filling opening can be advantageously embodied as a throttle point to dampen pressure spikes during the application of the encapsulating material. Advantageously, pressure spikes of the encapsulating material entering the filling opening can therefore not act on the electrical component undamped.

The protective cap can advantageously comprise a cap wall peripherally surrounding the electrical component and mounted perpendicularly on the circuit board substrate, and a cover section on the side facing away from the circuit board substrate over the electrical component, wherein the filling opening is provided in the transition region between the cover section and the cap wall. This achieves a simple structure in which the cap wall protects the electrical component in relation to all force vectors acting parallel to the circuit board substrate, while the cover part protects the side of the electrical component facing away from the circuit board substrate. The filling opening can be disposed in the transition region particularly easily.

It is also advantageous if the cover section has a collar protruding into the interior of the cap. The collar of the cover section protruding into the interior of the cap can advantageously contain the electrical component at the end thereof that is turned away from the circuit board substrate, in such a way that there is only a very narrow space, which is connected to the free space, between the collar and the electrical component. In this way, it is very easy to achieve that the free space is not completely filled with the encapsulating material.

An embodiment is particularly advantageous in which the protective cap has multiple internal cap chambers, in each of which an electric component is arranged. The protective cap can be produced advantageously as a low-cost plastic component for the electrical assembly and is inexpensive and easy to assemble on the circuit board substrate over the electrical components to be protected.

Without being limited to this, the electrical assembly can be particularly advantageously used for electrical components that are provided as a capacitor, especially as an electrolytic capacitor.

DETAILED DESCRIPTION

Figure 1:
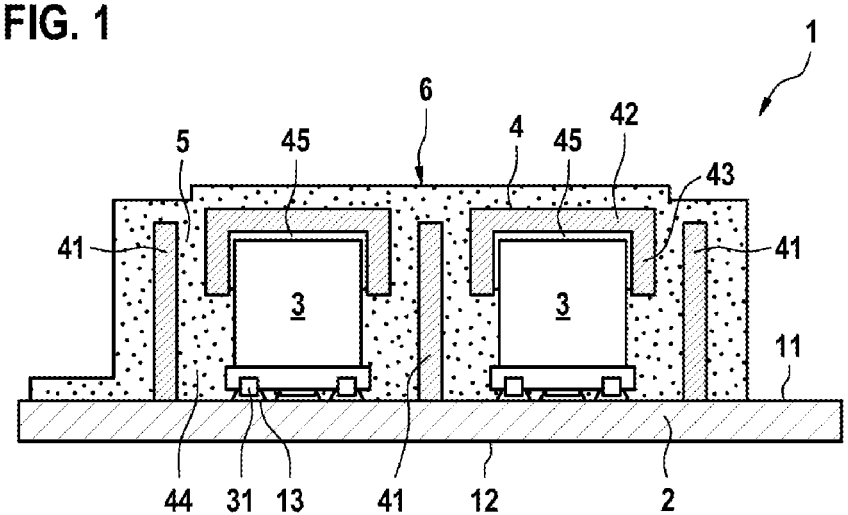
FIG. 1 shows a cross-section through a ready-made electrical assembly according to the disclosure.

FIG. 1 shows a cross-section through a finished electrical assembly 1 according to the disclosure. Only a partial section is shown that comprises a circuit board substrate 2, which is populated by two electrical components 3 here. The electric components 3, for example, are electrolytic capacitors, especially polymer-hybrid electrolytic capacitors. The electrical components 3 have connector elements 31 on their mounting side, which are electrically contacted by contact areas 13 on the mounting side 11 of the circuit board substrate 2 by soldering, for example. The electrical components 3 can have an essentially cylindrical base shape with two end faces that are facing away from each other and a peripheral wall that is circular in cross-section. The circuit board substrate 2 can be a multi-layer circuit board. The contact surfaces 13 can be connected via circuit boards of the circuit board substrate 2 to a control circuit that is not shown, which can also be disposed on the circuit board substrate (not shown). The electrical assembly 1 can be a subsection of a transmission control module or a sensor module, for example.

As is shown in FIG. 1, a protective cap 4 is placed on the circuit board substrate 2. The protective cap 4 can be made of plastic or metal or a plastic metal composite and is preferably made in one piece. The protective cap 4 can have a cap internal chamber 44 for each of the electrical components 3 that is assigned to said component 3. The respective internal chamber of the cap 3 is bounded by a wraparound cap wall 41 and a cover section 42. The protective cap 4 is placed perpendicularly on the component side 11 of the circuit board substrate in such a way that the cap wall 41 covers each of the electrical components 3 peripherally and the respective cover section 42 is disposed above the side of the associated electrical component 3 facing away from the printed circuit board substrate 2. In the transition region between the cover section 42 and the cap wall 41, at least one filling opening 5 is provided for each internal chamber 44 of the cap. In the cross-section in FIG. 1, two filling openings 5 are assigned to each internal chamber of the cap. Each cover section 42 comprises a collar 43 protruding into the internal chamber 44 of the cap. The collar 43 of the cover section 42 protruding into the internal chamber 44 of the cap comprises the assigned electrical component 3 at the end 14 thereof facing away from the circuit board substrate 2 in such a way that there is a very narrow gap 66 between the collar 43 and the electrical component 3 that is connected to a free space 45. The free space 45 is located on the side of the electrical component 3 facing away from the circuit board substrate 2 between the component 3 and the inside of the cover section 42 and therefore directly adjoins the electrical component 3. When viewed in cross-section perpendicular to the circuit board substrate 2, each filling opening 5 of the protective cap 4 is connected to the assigned free space 45 by a labyrinthine, especially U-shaped channel structure 67, as indicated by the dot-dashed line in FIG. 4.

Figure 2:
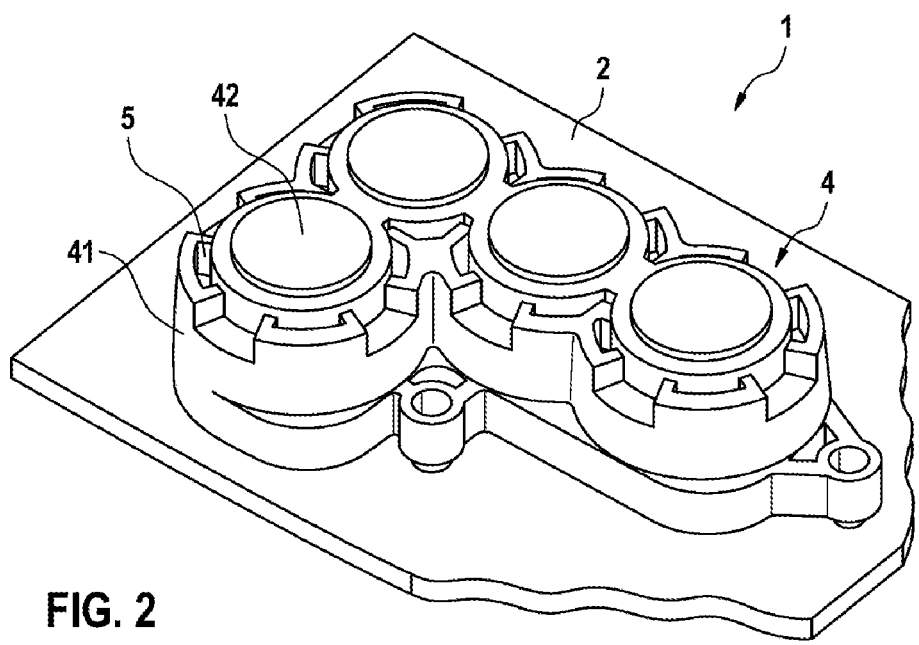
FIG. 2 shows a top view of an electrical assembly according to the disclosure without the encapsulating material.

FIG. 2 shows an external view of another exemplary embodiment of the disclosure without the encapsulating material applied. It can be seen that the protective cap 4 is embodied as a molded part with a peripheral cap wall 41, which also forms intermediate walls between the four internal chambers 44 of the cap, and with, for example, four cover sections 42 that are assigned to the respective electrical components. For example, four filling openings 5 are assigned to each internal chamber of the cap.

Figure 3:
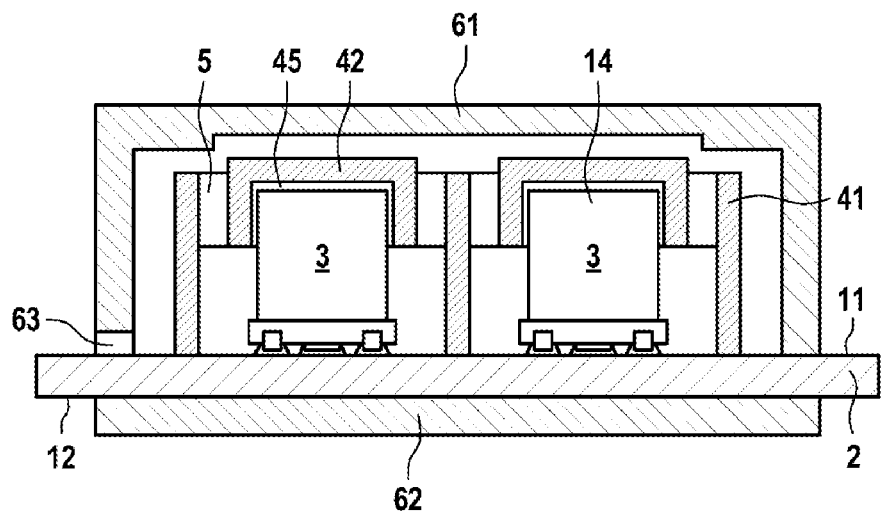
FIG. 3 shows a first step in the production of the electrical assembly from FIG. 1.

The production of the electrical assembly 1 is shown in FIGS. 3 through 6. As shown in FIG. 3, the protective cap 4 is first placed on the circuit board substrate 2, which is provided with the electrical components 3, in such a way that the cap wall 41 is placed on the component side 11 of the circuit board substrate and each electrical component 3 is disposed in a dedicated internal chamber 44 of the cap. The electrical assembly 1 is then inserted into a tool mold together with the protective cap 4. The tool mold can be in two parts and comprises a first die half 61 applied to the component side 11 of the circuit board substrate 2 and a second die half 62 placed on the underside 12 of the circuit board substrate 2. A casting channel 63 is provided between the component side 11 and the first die half 61.

Figure 4:
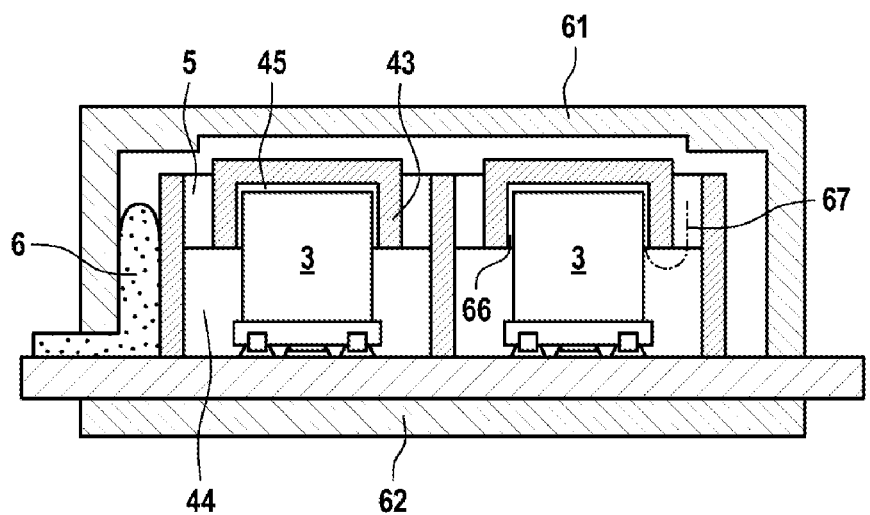
FIG. 4 shows a second step in the production of the electrical assembly of FIG. 1.

As shown in FIG. 4, a fluid encapsulating material 6 is applied to the component side 11 of the circuit board substrate 2. The encapsulating material 6 can be a thermosetting material for example, especially an epoxy resin. The encapsulating material can, for example, be applied to the circuit board substrate by a transfer molding process, a compression molding process, thermosetting material spraying or a casting process. In doing so, pressure can be applied so that the flowing encapsulating material 6 enters the casting channel 63.

Figure 5:
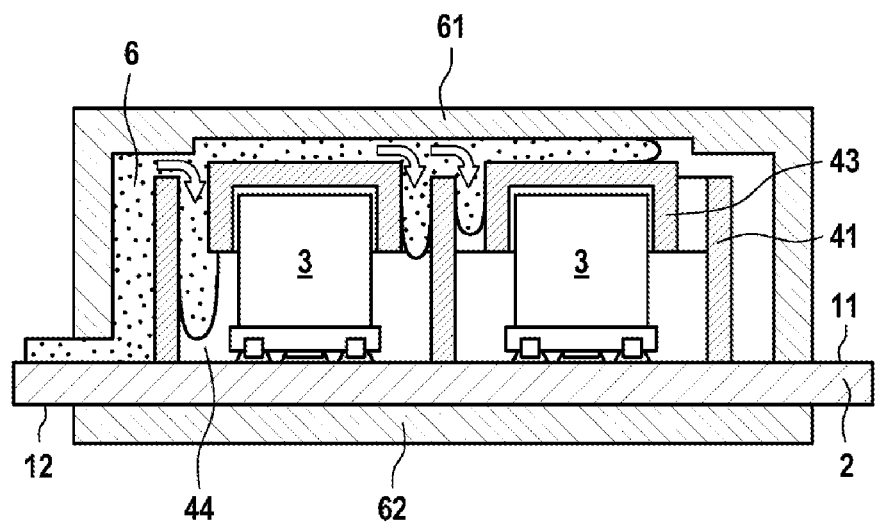
FIG. 5 shows a third step in the production of the electrical assembly of FIG. 1.

As shown in FIG. 5, the flowing encapsulating material 6 rises in the gap between the first die half 61 and the cap wall 41, and flows over the cover sections 42. As indicated by the arrows in FIG. 5, the encapsulating material penetrates into the transition region of the cap wall 41 and the cover section 42 over the filling openings 5 disposed there under the influence of applied pressure and/or that of gravity, which acts from top to bottom in FIG. 5, and into the interior of the cap 44. The at least one filling opening 5 has an advantageous effect as a throttle point and prevents pressure spikes from acting undamped on the electrical component 3 during the encapsulating material 6 filling process.

Figure 6:
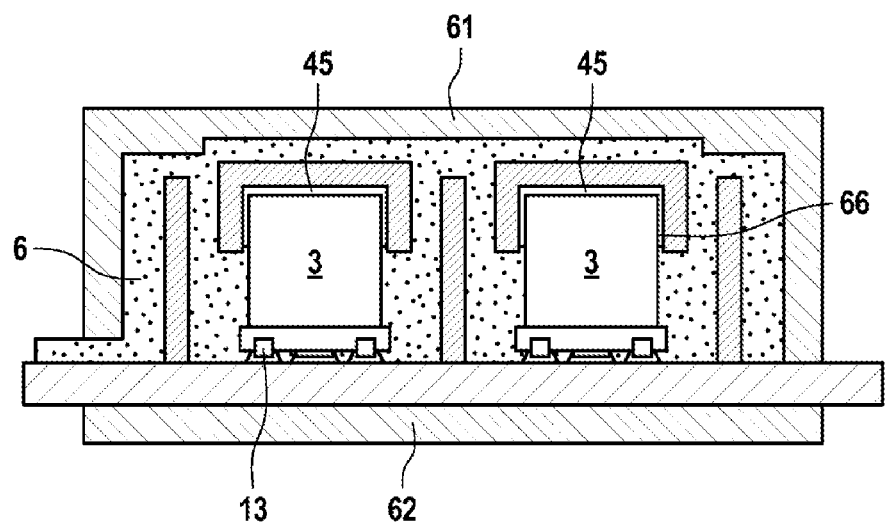
FIG. 6 shows a fourth step in the production of the electrical assembly of FIG. 1.

The encapsulating material 6 entering the internal chamber 44 of the cap first penetrates in the direction of the surface 11 of the circuit board substrate 2, which is facing the internal chamber of the cap, and flows around the electrical connections 31 of the electrical components 2. Then, as is shown in FIG. 6 the encapsulating material 6 rises in the internal chamber 44 of the cap up to the bottom edge of the collar 43 but does not penetrate through the narrow gap 66 into the free space 45. Air displaced from the interior of the cap by the encapsulating material is compressed in the free space.

After making the encapsulation, the die halves are removed 61, 62 to obtain the finished end product represented in FIG. 1.

The invention claimed is:

1. An electrical assembly comprising:
   a circuit board substrate;
   at least one electrical component disposed on the circuit board substrate and electrically connected to the circuit board substrate;
   a protective cap placed over the electrical component; and
   an encapsulating material applied to the circuit board substrate over the protective cap, which at least covers the protective cap from the outside,
   wherein the protective cap defines at least one filling opening, and
   wherein the encapsulating material is introduced via the at least one filling opening into an internal chamber of the protective cap defined between the protective cap and the circuit board substrate in such a way that a free space remains between the protective cap and the circuit board substrate that is not filled with the encapsulating material, the free space directly adjoining the at least one electrical component.

2. The electrical assembly as claimed in claim 1, wherein the free space that is not filled with the encapsulating material forms a balancing chamber and the at least one electrical component or parts of the at least one electrical component are configured to partially expand into the balancing chamber.

3. The electrical assembly as claimed in claim 1, wherein the at least one filling opening of the protective cap is connected to the free space via a channel structure that is labyrinthine when viewed in cross-section perpendicular to the circuit board substrate.

4. The electrical assembly as claimed in claim 3, wherein the a channel structure is U-shaped, when viewed in cross-section perpendicular to the circuit board substrate.

5. The electrical assembly as claimed in claim 1, wherein the at least one filling opening is formed as a throttle point so as to dampen pressure spikes during filling of the encapsulating material.

6. The electrical assembly as claimed in claim 1, wherein the protective cap comprises:
   a cap wall peripherally enveloping an electrical component of the at least one electrical component, the cap wall placed perpendicularly on the conductor substrate; and
   a cover section on a side facing away from the circuit board substrate and over the electrical component,
   wherein the filling opening is defined in a transition region between the cover section and the cap wall.

7. The electrical assembly as claimed in claim 6, wherein the cover section comprises a collar protruding into the internal chamber of the protective cap.

8. The electrical assembly as claimed in claim 7, wherein the collar of the cover section protruding into the internal chamber of the protective cap includes the electrical component at an end of the collar facing away from the circuit board substrate in such a way that there is a very narrow space defined between the collar and the electrical component that is connected to the free space.

9. The electrical assembly as claimed in claim 1, wherein the free space is filled with a gas.

10. The electrical assembly as claimed in claim 9, wherein the free space is filled with air.

11. The electrical assembly as claimed in claim 1, wherein the protective cap defines a plurality of internal cap chambers, and an electrical component of the plurality of electrical components is disposed in each of the plurality of internal cap chambers.

12. The electrical assembly as claimed in claim 1, wherein one or more of the at least one electrical components is a capacitor.

13. The electrical assembly as claimed in claim 12, wherein the capacitor is an electrolytic capacitor.

14. The electrical assembly as claimed in claim 1, wherein the electrical assembly is configured for use in a hydraulic fluid of a motor vehicle transmission.

* * * * *